(12) United States Patent
Dejneka et al.

(10) Patent No.: US 10,297,787 B2
(45) Date of Patent: May 21, 2019

(54) LASER WELDING OF HIGH THERMAL EXPANSION GLASSES AND GLASS-CERAMICS

(71) Applicant: Corning Incorporated, Corning, NY (US)

(72) Inventors: Matthew John Dejneka, Corning, NY (US); Alexander Mikhailovich Streltsov, Corning, NY (US)

(73) Assignee: Corning Incorporated, Corning, NY (US)

( * ) Notice: Subject to any disclaimer, the term of this patent is extended or adjusted under 35 U.S.C. 154(b) by 259 days.

(21) Appl. No.: 15/305,553

(22) PCT Filed: Apr. 20, 2015

(86) PCT No.: PCT/US2015/026626
§ 371 (c)(1),
(2) Date: Oct. 20, 2016

(87) PCT Pub. No.: WO2015/164241
PCT Pub. Date: Oct. 29, 2015

(65) Prior Publication Data
US 2017/0047542 A1    Feb. 16, 2017

Related U.S. Application Data

(60) Provisional application No. 61/982,015, filed on Apr. 21, 2014.

(51) Int. Cl.
*H01L 51/52* (2006.01)
*B23K 26/57* (2014.01)
(Continued)

(52) U.S. Cl.
CPC ...... *H01L 51/5246* (2013.01); *B23K 26/0869* (2013.01); *B23K 26/206* (2013.01);
(Continued)

(58) Field of Classification Search
CPC .................................................. H01L 51/5246
See application file for complete search history.

(56) References Cited

U.S. PATENT DOCUMENTS

| 4,879,450 A | 11/1989 | Valentin et al. |
| 7,565,817 B2 | 7/2009 | Schroeder, III |

(Continued)

FOREIGN PATENT DOCUMENTS

| CN | 102583986 A | 7/2012 |
| CN | 103466921 A | 12/2013 |

(Continued)

OTHER PUBLICATIONS

Dagmar Hulsenberg et al., "Joining Methods for Glass Based Microdevices", Microstructuring of Glasses, Jan. 1, 2008, pp. 263-278.

(Continued)

*Primary Examiner* — Daniel H Lee
(74) *Attorney, Agent, or Firm* — Ryan T. Hardee (57) ABSTRACT

Disclosed herein are methods for welding a first substrate and a second substrate, the method comprising bringing the first and second substrates into contact to form a substrate interface, and directing a laser beam operating at a predetermined wavelength through the second substrate onto the substrate interface, wherein the first substrate absorbs light from the laser beam in an amount sufficient to form a weld between the first substrate and the second substrate. The disclosure also relates to glass and/or glass-ceramic packaging and OLED display produced according to the methods disclosed herein.

26 Claims, 2 Drawing Sheets

(51) Int. Cl.
| | |
|---|---|
| B23K 26/20 | (2014.01) |
| C03C 3/091 | (2006.01) |
| C03C 3/093 | (2006.01) |
| C03C 3/095 | (2006.01) |
| C03C 23/00 | (2006.01) |
| C03C 27/00 | (2006.01) |
| C03B 23/203 | (2006.01) |
| C04B 37/04 | (2006.01) |
| C04B 37/00 | (2006.01) |
| B23K 26/21 | (2014.01) |
| B23K 26/08 | (2014.01) |
| B23K 26/324 | (2014.01) |
| C03C 3/062 | (2006.01) |
| C03C 3/064 | (2006.01) |
| C03C 3/068 | (2006.01) |
| C03C 3/076 | (2006.01) |
| C03C 3/078 | (2006.01) |
| C03C 3/083 | (2006.01) |
| C03C 3/085 | (2006.01) |
| C03C 3/087 | (2006.01) |
| C03C 3/089 | (2006.01) |
| C03C 10/00 | (2006.01) |
| H01L 51/56 | (2006.01) |
| B23K 26/244 | (2014.01) |
| B23K 101/36 | (2006.01) |
| B23K 103/00 | (2006.01) |

(52) U.S. Cl.
CPC ............ *B23K 26/21* (2015.10); *B23K 26/244* (2015.10); *B23K 26/324* (2013.01); *B23K 26/57* (2015.10); *C03B 23/203* (2013.01); *C03C 3/062* (2013.01); *C03C 3/064* (2013.01); *C03C 3/068* (2013.01); *C03C 3/076* (2013.01); *C03C 3/078* (2013.01); *C03C 3/083* (2013.01); *C03C 3/085* (2013.01); *C03C 3/087* (2013.01); *C03C 3/089* (2013.01); *C03C 3/091* (2013.01); *C03C 3/093* (2013.01); *C03C 3/095* (2013.01); *C03C 10/00* (2013.01); *C03C 23/005* (2013.01); *C03C 27/00* (2013.01); *C04B 37/001* (2013.01); *C04B 37/042* (2013.01); *C04B 37/045* (2013.01); *H01L 51/56* (2013.01); *B23K 2101/36* (2018.08); *B23K 2103/52* (2018.08); *B23K 2103/54* (2018.08); *C04B 2235/665* (2013.01); *Y02P 40/57* (2015.11)

(56) References Cited

U.S. PATENT DOCUMENTS

| | | | |
|---|---|---|---|
| 8,148,179 | B2 | 4/2012 | Aitken et al. |
| 8,379,392 | B2 | 2/2013 | Bita et al. |
| 2004/0082145 | A1 | 4/2004 | Reichenbach et al. |
| 2005/0116245 | A1* | 6/2005 | Aitken .................. C03B 23/245 257/99 |
| 2005/0174042 | A1 | 8/2005 | Nichikawa et al. |
| 2007/0051706 | A1* | 3/2007 | Bovatsek ........... B23K 26/0617 219/121.69 |
| 2008/0168801 | A1* | 7/2008 | Danielson ............. C03B 23/203 65/32.2 |
| 2009/0221207 | A1* | 9/2009 | Russell .................. C03C 27/06 445/25 |
| 2012/0131959 | A1 | 5/2012 | No et al. |
| 2013/0112650 | A1 | 5/2013 | Karam et al. |
| 2013/0126938 | A1 | 5/2013 | Eberhardt et al. |

FOREIGN PATENT DOCUMENTS

| | | |
|---|---|---|
| CN | 101896680 B | 12/2014 |
| EP | 1117502 B1 | 1/2003 |
| TW | 201041820 A | 12/2010 |
| WO | 2014052711 A1 | 4/2014 |

OTHER PUBLICATIONS

Dagmar Hulsenberg et al., "Laser Beam Welding", Microstructuring of Glasses, Jan. 1, 2008, pp. 267-268.

Taiwan Patent Application No. 104112593 Search Report dated Oct. 16, 2018; 1 Page; Taiwan Patent Office.

* cited by examiner

LASER WELDING OF HIGH THERMAL EXPANSION GLASSES AND GLASS-CERAMICS

CROSS-REFERENCE TO RELATED APPLICATIONS

This application claims the benefit of priority under 35 U.S.C. § 371 of International Patent Application Ser. No. PCT/US15/26626, filed on Apr. 20, 2015, which in turn, claims the benefit of priority of U.S. Provisional Patent Application Ser. No. 61/982,015 filed on Apr. 21, 2014, the contents of each of which are relied upon and incorporated herein by reference in their entireties.

FIELD OF THE DISCLOSURE

The present disclosure relates generally to methods for welding high thermal expansion substrates, and more particularly to methods for hermetically sealing glass and glass-ceramic substrates having a high coefficient of thermal expansion using laser welding.

BACKGROUND

Hermetically bonded glass packages and casings are increasingly popular for application to electronics and other devices that may benefit from a hermetic environment for sustained operation. Exemplary devices which may benefit from hermetic packaging include televisions, sensors, optical devices, organic light emitting diode (OLED) displays, 3D inkjet printers, solid-state lighting sources, and photovoltaic structures.

Glass, ceramic, and/or glass-ceramic substrates have been traditionally sealed by placing the substrates in a furnace, with or without an epoxy or other sealing material. However, the furnace typically operates at high processing temperatures which are unsuitable for many devices, such as OLEDs. For example, OLEDs generally must be processed at temperatures less than about 100° C., or even less than about 85° C., to protect the heat-sensitive components.

Other prior art methods include placing an absorbing layer or glass frit between the substrates. However, the addition of such layers can complicate the sealing process, introduce contaminants, and/or increase the operation cost. Glass frit is also often processed at higher temperatures unsuitable for devices such as OLEDs and/or may produce undesirable gasses upon sealing.

Glass substrates have been hermetically sealed by Applicant without an intermediate layer using ultrafast lasers. However, these direct glass-to-glass methods have only been successful thus far with glasses having a low coefficient of thermal expansion (CTE) (e.g., about 4 ppm/° C. or less). Similarly, glass frit methods have also traditionally been used to seal only low expansion glasses.

Attempts to seal high expansion glasses have thus been unsuccessful, are limited by a low speed (about 10 mm/s or less), and/or require substrate heating with increased speeds (about 20 mm/s), all of which can result in higher hermetic package manufacturing time, cost, and/or complexity. Accordingly, it would be advantageous to provide methods for welding high-CTE (e.g., >5 ppm/° C.) substrates at higher speeds and lower temperatures, which may, among other advantages, decrease manufacturing costs and/or increase production rate. The resulting sealed packages can be used to protect a wide array of electronics and other devices, such as OLEDs.

SUMMARY

The disclosure relates, in various embodiments, to methods for welding a first substrate and a second substrate, the method comprising bringing the first and second substrates into contact to form a substrate interface, and directing a laser beam operating at a predetermined wavelength through the second substrate onto the substrate interface, wherein the first substrate absorbs light from the laser beam in an amount sufficient to form a weld between the first substrate and the second substrate.

According to various embodiments, the first substrate has an absorption at the predetermined wavelength of greater than about 10 $cm^{-1}$ and the second substrate has an absorption at the predetermined wavelength of less than about 1 $cm^{-1}$. In other embodiments, at least one of the first and second substrates has a coefficient of thermal expansion (CTE) of greater than about 5 ppm/° C. The first and second substrates may, in certain embodiments, be chosen from glasses, ceramics, and glass-ceramics, which may be optionally chemically strengthened, chemically tempered and/or thermally tempered. According to further embodiments, the laser may operate at UV, visible, and near-infrared (NIR) wavelengths. In yet further embodiments, the first and second substrates may be welded together so as to form a hermetic seal.

The disclosure also relates to hermetically sealed glass and/or glass-ceramic packages and OLED displays produced according to methods disclosed herein.

Additional features and advantages of the disclosure will be set forth in the detailed description which follows, and in part will be readily apparent to those skilled in the art from that description or recognized by practicing the methods as described herein, including the detailed description which follows, the claims, as well as the appended drawings.

It is to be understood that both the foregoing general description and the following detailed description present various embodiments of the disclosure, and are intended to provide an overview or framework for understanding the nature and character of the claims. The accompanying drawings are included to provide a further understanding of the disclosure, and are incorporated into and constitute a part of this specification. The drawings illustrate various embodiments of the disclosure and together with the description serve to explain the principles and operations of the disclosure.

BRIEF DESCRIPTION OF THE DRAWINGS

The following detailed description can be best understood when read in conjunction with the following drawings, where like structures are indicated with like reference numerals and in which.

DETAILED DESCRIPTION

Disclosed herein is a method for welding a first substrate and a second substrate, the method comprising bringing the first and second substrates into contact to form a substrate interface, and directing a laser beam operating at a predetermined wavelength through the second substrate onto the substrate interface, wherein the first substrate absorbs light from the laser beam in an amount sufficient to form a weld between the first substrate and the second substrate, wherein the first substrate has an absorption at the predetermined wavelength of greater than about 10 cm$^{-1}$ and the second substrate has an absorption at the predetermined wavelength of less than about 1 cm$^{-1}$, and wherein, at least one of the first and second substrates has a coefficient of thermal expansion (CTE) of greater than about 5 ppm/° C. Sealed glass and/or glass-ceramic packages and OLED displays produced according to these methods are also disclosed herein.

Materials

The present disclosure relates to the sealing, e.g., welding or hermetic sealing, of glass, ceramic, glass-ceramic substrates, and/or other substrates. In certain embodiments, the first and second substrates may be chosen from glasses and glass-ceramics. By way of a non-limiting example, the first and second substrates may be chosen from soda-lime silicate, aluminosilicate, alkali-aluminosilicate, borosilicate, alkali-borosilicate, aluminoborosilicate, and alkali-aluminoborosilicate glasses and glass-ceramics. These substrates may, in various embodiments, be chemically strengthened, chemically tempered, and/or thermally tempered. Non-limiting examples of suitable commercially available substrates include EAGLE XG®, Lotus™, Willow®, and Gorilla® glasses from Corning Incorporated, including glass-ceramics produced from these glasses, as well as chemically strengthened, chemically tempered, and/or thermally tempered versions thereof. Glasses and glass-ceramics that have been chemically strengthened by ion exchange may be suitable as substrates according to some non-limiting embodiments. In other embodiments, the first and/or second substrate may be a pre-stressed laminate.

According to further embodiments, the first and/or second substrates may have a compressive stress greater than about 100 MPa and a depth of layer of compressive stress (DOL) greater than about 10 microns. In further embodiments, the first and/or second substrates may have a compressive stress greater than about 500 MPa and a DOL greater than about 20 microns.

The first substrate may, in various embodiments, be the sealing substrate, e.g., the substrate that absorbs light from the laser beam so as to form a weld or seal between the first and second substrates. In certain embodiments, the first substrate may be heated by the light absorption from the laser beam and may swell to form the weld or hermetic seal. Accordingly, the first substrate may have an absorption greater than about 10 cm$^{-1}$ at the laser's given operating wavelength, for example, greater than about 15 cm$^{-1}$, greater than about 20 cm$^{-1}$, greater than about 30 cm$^{-1}$, greater than about 40 cm$^{-1}$, or greater than about 50 cm$^{-1}$. To achieve high absorption levels, the first substrate may be doped with an absorbing species, such as a transition metal or rare earth metal ion. The substrate can also be thermally struck in to precipitate a chromophore or form a highly colored glass-ceramic. Other suitable absorbing substrates are disclosed in International Application No. PCT/US2013/062106, filed by Applicant on Sep. 27, 2013, which is incorporated herein by reference in its entirety.

According to certain embodiments, the first substrate may comprise at least one transition metal oxide or rare earth oxide. For example the first substrate may comprise at least one oxide chosen from iron, copper, vanadium, manganese, cobalt, nickel, chromium, yttrium, and lanthanum oxides. The amount of transition metal or rare earth oxide may vary depending on the desired absorption properties of the first substrate, but may range, for example, from about 0.05-10 mol %, such as about 0.1-5 mol %, about 0.2-3 mol %, about 0.3-2 mol %, or about 0.5-1 mol %, including all ranges and subranges therebetween.

The first substrate may have any suitable composition providing sufficient absorption at the desired wavelength. By way of a non-limiting example, the first substrate may be a glass or glass-ceramic comprising from about 30-75 mol % $SiO_2$, about 0-40 mol % $Al_2O_3$, about 0-15 mol % $B_2O_3$, about 0-20 mol % $Na_2O$, about 0-10 mol % $K_2O$, about 0-20 mol % $Li_2O$, about 0-10 mol % MgO, about 0-10 mol % CaO, about 0-1 mol % $SnO_2$, about 0-5 mol % $ZrO_2$, about 0-10 mol % $TiO_2$, and about 0.05-10 mol % of at least one transition metal oxide or rare earth oxide described above. In additional non-limiting embodiments, the first substrate comprises about 30-75 mol % $SiO_2$, about 0-40 mol % $Al_2O_3$, about 0-15 mol % $B_2O_3$, about 5-35 mol % ($Li_2O$+$Na_2O$+$K_2O$), about 5-35 mol % (MgO+CaO), about 0-1 mol % $SnO_2$, about 0-5 mol % $ZrO_2$, about 0-10 mol % $TiO_2$, and about 0.05-10 mol % of at least one transition metal oxide or rare earth oxide.

According to further embodiments, the first substrate may comprise from about 60-70 mol % $SiO_2$, about 5-15 mol % $Al_2O_3$, about 1-10 mol % $B_2O_3$, about 5-20 mol % $Na_2O$, about 0-5 mol % $K_2O$, about 0-5 mol % $Li_2O$, about 1-5 mol % MgO, about 0-5 mol % CaO, about 0-0.5 mol % $SnO_2$, about 0-1 mol % $ZrO_2$, about 0.1-5 mol % $TiO_2$, and about 0.1-3 mol % of at least one transition metal oxide or rare earth oxide. According to still further embodiments, the first substrate may comprise from about 62-68 mol % $SiO_2$, about 10-14 mol % $Al_2O_3$, about 3-10 mol % $B_2O_3$, about 5-18 mol % $Na_2O$, about 0-5 mol % $K_2O$, about 0-5 mol % $Li_2O$, about 1-3 mol % MgO, about 0-2 mol % CaO, about 0-0.2 mol % $SnO_2$, about 0-0.5 mol % $ZrO_2$, about 0.5-2 mol % $TiO_2$, and about 0.5-2 mol % of at least one transition metal oxide or rare earth oxide.

The compositions of specific but non-limiting glasses and/or glass-ceramics are provided in Table IA below, along with the observed CTE value for these substrates.

TABLE IA

| | Exemplary Glass and Glass-Ceramic Substrates | | | | | | |
|---|---|---|---|---|---|---|---|
| | 1 | 2 | 3 | 4 | 5 | 6 | 7 |
| $SiO_2$ | 63.813 | 64.046 | 64.277 | 64.306 | 64.404 | 64.357 | 64.201 |
| $Al_2O_3$ | 13.834 | 13.599 | 13.240 | 13.267 | 13.327 | 13.297 | 13.274 |
| $B_2O_3$ | 5.082 | 5.173 | 5.369 | 5.241 | 5.188 | 5.173 | 5.298 |
| $Li_2O$ | 0.000 | 0.000 | 0.000 | 0.000 | 0.000 | 0.000 | 0.000 |
| $Na_2O$ | 13.614 | 13.766 | 13.794 | 13.881 | 13.794 | 13.835 | 13.902 |
| $K_2O$ | 0.015 | 0.014 | 0.002 | 0.002 | 0.002 | 0.002 | 0.001 |
| MgO | 1.747 | 1.431 | 2.040 | 1.546 | 1.274 | 1.898 | 1.805 |
| CaO | 0.034 | 0.031 | 0.036 | 0.031 | 0.031 | 0.035 | 0.033 |
| $SnO_2$ | 0.049 | 0.053 | 0.003 | 0.003 | 0.003 | 0.003 | 0.003 |

TABLE IA-continued

Exemplary Glass and Glass-Ceramic Substrates

| | | | | | | | |
|---|---|---|---|---|---|---|---|
| $ZrO_2$ | 0.028 | 0.062 | 0.000 | 0.000 | 0.000 | 0.000 | 0.000 |
| $TiO_2$ | 1.202 | 0.977 | 0.734 | 1.217 | 1.470 | 1.079 | 0.980 |
| $Fe_2O_3$ | 0.567 | 0.736 | 0.505 | 0.506 | 0.506 | 0.322 | 0.503 |
| MnO | 0.016 | 0.111 | 0.000 | 0.000 | 0.000 | 0.000 | 0.000 |
| CTE (ppm/° C.) | 7.41 | 7.47 | 7.55 | 7.60 | 7.54 | 7.58 | 7.72 |

| | 8 | 9 | 10 | 11 | 12 | 13 |
|---|---|---|---|---|---|---|
| $SiO_2$ | 64.248 | 66.710 | 63.908 | 63.889 | 65.667 | 66.720 |
| $Al_2O_3$ | 13.267 | 11.880 | 13.579 | 13.339 | 12.945 | 11.868 |
| $B_2O_3$ | 5.282 | 6.750 | 5.355 | 5.443 | 4.009 | 6.749 |
| $Li_2O$ | 0.000 | 4.420 | 0.000 | 0.000 | 0.000 | 4.437 |
| $Na_2O$ | 13.902 | 6.790 | 13.784 | 13.936 | 13.242 | 6.709 |
| $K_2O$ | 0.002 | 0.480 | 0.018 | 0.019 | 0.463 | 0.479 |
| MgO | 1.693 | 1.570 | 1.554 | 1.511 | 1.662 | 1.570 |
| CaO | 0.032 | 0.000 | 0.032 | 0.030 | 0.035 | 0.040 |
| $SnO_2$ | 0.003 | 0.000 | 0.038 | 0.034 | 0.023 | 0.021 |
| $ZrO_2$ | 0.000 | 0.000 | 0.009 | 0.013 | 0.009 | 0.008 |
| $TiO_2$ | 0.882 | 0.880 | 1.183 | 1.225 | 1.265 | 0.862 |
| $Fe_2O_3$ | 0.689 | 0.520 | 0.519 | 0.542 | 0.661 | 0.516 |
| MnO | 0.000 | 0.000 | 0.000 | 0.000 | 0.000 | 0.000 |
| CTE (ppm/° C.) | 7.66 | 6.04 | 7.50 | 7.51 | 7.60 | 6.03 |

Compositions of additional exemplary glasses and/or glass-ceramics are provided in Table IB below.

TABLE IB

Exemplary Glass and Glass-Ceramic Substrates

| Glass Code | SiO2 | Al2O3 | B2O3 | Li2O | Na2O | K2O | MgO | CaO | SnO2 | ZrO2 | TiO2 | Fe2O3 | MnO | CoO |
|---|---|---|---|---|---|---|---|---|---|---|---|---|---|---|
| 1 | 63.768 | 13.918 | 5.120 | 0.000 | 13.714 | 0.015 | 1.922 | 0.038 | 0.092 | 0.016 | 0.976 | 0.417 | 0.004 | 0.000 |
| 2 | 63.690 | 13.945 | 5.126 | 0.000 | 13.734 | 0.015 | 1.795 | 0.036 | 0.116 | 0.025 | 0.979 | 0.534 | 0.005 | 0.000 |
| 3 | 63.738 | 13.955 | 5.124 | 0.000 | 13.686 | 0.014 | 1.750 | 0.034 | 0.117 | 0.026 | 0.996 | 0.554 | 0.005 | 0.000 |
| 4 | 63.792 | 13.925 | 5.125 | 0.000 | 13.663 | 0.015 | 1.740 | 0.121 | 0.028 | 0.028 | 0.985 | 0.565 | 0.005 | 0.000 |
| 5 | 63.824 | 13.886 | 5.104 | 0.000 | 13.761 | 0.014 | 1.745 | 0.032 | 0.060 | 0.029 | 0.976 | 0.564 | 0.005 | 0.000 |
| 6 | 63.803 | 13.989 | 5.098 | 0.000 | 13.655 | 0.014 | 1.747 | 0.034 | 0.060 | 0.028 | 0.986 | 0.581 | 0.005 | 0.000 |
| 7 | 63.713 | 13.832 | 5.085 | 0.000 | 13.759 | 0.015 | 1.745 | 0.035 | 0.051 | 0.035 | 0.978 | 0.565 | 0.187 | 0.000 |
| 8 | 63.767 | 13.964 | 5.076 | 0.000 | 13.560 | 0.016 | 1.751 | 0.036 | 0.056 | 0.034 | 0.985 | 0.565 | 0.190 | 0.000 |
| 9 | 63.813 | 13.834 | 5.082 | 0.000 | 13.614 | 0.015 | 1.747 | 0.034 | 0.049 | 0.028 | 1.202 | 0.567 | 0.016 | 0.000 |
| 10 | 63.805 | 13.695 | 5.106 | 0.000 | 13.604 | 0.016 | 1.740 | 0.034 | 0.046 | 0.031 | 1.353 | 0.562 | 0.008 | 0.000 |
| 11 | 63.829 | 13.662 | 5.133 | 0.000 | 13.621 | 0.015 | 1.758 | 0.035 | 0.047 | 0.029 | 1.238 | 0.625 | 0.007 | 0.000 |
| 12 | 63.962 | 13.608 | 5.169 | 0.000 | 13.626 | 0.014 | 1.754 | 0.032 | 0.063 | 0.056 | 1.002 | 0.708 | 0.006 | 0.000 |
| 13 | 63.937 | 13.597 | 5.179 | 0.000 | 13.664 | 0.015 | 1.749 | 0.035 | 0.058 | 0.057 | 0.993 | 0.709 | 0.007 | 0.000 |
| 14 | 64.046 | 13.599 | 5.173 | 0.000 | 13.766 | 0.014 | 1.431 | 0.031 | 0.053 | 0.062 | 0.977 | 0.736 | 0.111 | 0.000 |
| 15 | 64.232 | 13.577 | 5.187 | 0.000 | 13.698 | 0.015 | 1.221 | 0.030 | 0.047 | 0.067 | 0.980 | 0.752 | 0.194 | 0.000 |
| 16 | 65.075 | 13.193 | 4.968 | 0.000 | 13.176 | 0.014 | 1.728 | 0.032 | 0.030 | 0.040 | 0.983 | 0.747 | 0.012 | 0.000 |
| 17 | 65.056 | 13.125 | 5.034 | 0.000 | 13.216 | 0.015 | 1.749 | 0.031 | 0.021 | 0.022 | 0.981 | 0.742 | 0.007 | 0.000 |
| 18 | 64.919 | 13.189 | 5.060 | 0.000 | 13.163 | 0.014 | 1.751 | 0.031 | 0.020 | 0.020 | 0.983 | 0.677 | 0.007 | 0.167 |
| 19 | 64.907 | 13.133 | 5.153 | 0.000 | 13.114 | 0.014 | 1.734 | 0.033 | 0.020 | 0.021 | 0.973 | 0.634 | 0.005 | 0.257 |
| 20 | 65.155 | 13.308 | 4.854 | 0.000 | 12.158 | 0.949 | 1.738 | 0.040 | 0.019 | 0.016 | 0.992 | 0.753 | 0.006 | 0.012 |
| 21 | 65.457 | 12.952 | 4.498 | 0.000 | 13.042 | 0.388 | 1.537 | 0.035 | 0.018 | 0.015 | 1.304 | 0.741 | 0.006 | 0.008 |
| 22 | 65.999 | 12.698 | 3.742 | 0.000 | 13.601 | 0.038 | 1.620 | 0.030 | 0.016 | 0.010 | 1.472 | 0.762 | 0.006 | 0.006 |
| 23 | 65.966 | 12.771 | 3.683 | 0.000 | 13.617 | 0.020 | 1.406 | 0.030 | 0.017 | 0.015 | 1.491 | 0.763 | 0.218 | 0.006 |
| 24 | 65.960 | 12.702 | 3.707 | 0.000 | 12.789 | 0.879 | 1.606 | 0.030 | 0.016 | 0.013 | 1.497 | 0.762 | 0.033 | 0.006 |
| 25 | 66.129 | 12.734 | 3.693 | 0.000 | 13.168 | 0.552 | 1.630 | 0.030 | 0.017 | 0.013 | 1.323 | 0.677 | 0.026 | 0.006 |
| 26 | 64.277 | 13.240 | 5.369 | 0.000 | 13.794 | 0.002 | 2.040 | 0.036 | 0.003 | 0.000 | 0.734 | 0.505 | 0.000 | 0.000 |
| 27 | 64.306 | 13.267 | 5.241 | 0.000 | 13.881 | 0.002 | 1.546 | 0.031 | 0.003 | 0.000 | 1.217 | 0.506 | 0.000 | 0.000 |
| 28 | 64.404 | 13.327 | 5.188 | 0.000 | 13.794 | 0.002 | 1.274 | 0.031 | 0.003 | 0.000 | 1.470 | 0.506 | 0.000 | 0.000 |
| 29 | 64.357 | 13.297 | 5.173 | 0.000 | 13.835 | 0.002 | 1.898 | 0.035 | 0.003 | 0.000 | 1.079 | 0.322 | 0.000 | 0.000 |
| 30 | 64.201 | 13.274 | 5.298 | 0.000 | 13.902 | 0.001 | 1.805 | 0.033 | 0.003 | 0.000 | 0.980 | 0.503 | 0.000 | 0.000 |
| 31 | 64.248 | 13.267 | 5.282 | 0.000 | 13.902 | 0.002 | 1.693 | 0.032 | 0.003 | 0.000 | 0.882 | 0.689 | 0.000 | 0.000 |
| 32 | 66.710 | 11.880 | 6.750 | 4.420 | 6.790 | 0.480 | 1.570 | 0.000 | 0.000 | 0.000 | 0.880 | 0.520 | 0.000 | 0.000 |
| 33 | 63.908 | 13.579 | 5.355 | 0.000 | 13.784 | 0.018 | 1.554 | 0.032 | 0.038 | 0.009 | 1.183 | 0.519 | 0.000 | 0.000 |
| 34 | 63.904 | 13.557 | 5.364 | 0.000 | 13.784 | 0.019 | 1.553 | 0.032 | 0.042 | 0.009 | 1.192 | 0.525 | 0.000 | 0.000 |
| 35 | 63.829 | 13.526 | 5.371 | 0.000 | 13.849 | 0.019 | 1.551 | 0.032 | 0.042 | 0.010 | 1.218 | 0.534 | 0.000 | 0.000 |
| 36 | 63.753 | 13.496 | 5.378 | 0.000 | 13.915 | 0.019 | 1.550 | 0.031 | 0.042 | 0.011 | 1.244 | 0.543 | 0.000 | 0.000 |
| 37 | 63.866 | 13.506 | 5.384 | 0.000 | 13.826 | 0.020 | 1.534 | 0.031 | 0.039 | 0.010 | 1.227 | 0.538 | 0.000 | 0.000 |
| 38 | 63.831 | 13.525 | 5.386 | 0.000 | 13.805 | 0.019 | 1.531 | 0.047 | 0.042 | 0.012 | 1.242 | 0.541 | 0.000 | 0.000 |
| 39 | 63.829 | 13.530 | 5.410 | 0.000 | 13.819 | 0.018 | 1.502 | 0.035 | 0.038 | 0.013 | 1.243 | 0.543 | 0.000 | 0.000 |
| 40 | 63.885 | 13.430 | 5.404 | 0.000 | 13.849 | 0.017 | 1.524 | 0.032 | 0.040 | 0.012 | 1.242 | 0.545 | 0.000 | 0.000 |

TABLE IB-continued

Exemplary Glass and Glass-Ceramic Substrates

| Glass Code | SiO2 | Al2O3 | B2O3 | Li2O | Na2O | K2O | MgO | CaO | SnO2 | ZrO2 | TiO2 | Fe2O3 | MnO | CoO |
|---|---|---|---|---|---|---|---|---|---|---|---|---|---|---|
| 41 | 63.849 | 13.467 | 5.403 | 0.000 | 13.853 | 0.017 | 1.522 | 0.031 | 0.038 | 0.012 | 1.242 | 0.547 | 0.000 | 0.000 |
| 42 | 63.850 | 13.443 | 5.406 | 0.000 | 13.858 | 0.019 | 1.525 | 0.030 | 0.038 | 0.013 | 1.251 | 0.548 | 0.000 | 0.000 |
| 43 | 63.811 | 13.396 | 5.406 | 0.000 | 13.960 | 0.018 | 1.523 | 0.030 | 0.036 | 0.011 | 1.243 | 0.547 | 0.000 | 0.000 |
| 44 | 63.967 | 13.447 | 5.350 | 0.000 | 13.794 | 0.018 | 1.515 | 0.031 | 0.043 | 0.015 | 1.252 | 0.548 | 0.000 | 0.000 |
| 45 | 63.899 | 13.458 | 5.373 | 0.000 | 13.838 | 0.019 | 1.518 | 0.030 | 0.041 | 0.015 | 1.243 | 0.546 | 0.000 | 0.000 |
| 46 | 63.833 | 13.374 | 5.393 | 0.000 | 13.981 | 0.018 | 1.515 | 0.031 | 0.036 | 0.013 | 1.242 | 0.546 | 0.000 | 0.000 |
| 47 | 63.862 | 13.366 | 5.413 | 0.000 | 13.940 | 0.019 | 1.524 | 0.032 | 0.035 | 0.013 | 1.233 | 0.543 | 0.000 | 0.000 |
| 48 | 63.889 | 13.339 | 5.443 | 0.000 | 13.936 | 0.019 | 1.511 | 0.030 | 0.034 | 0.013 | 1.225 | 0.542 | 0.000 | 0.000 |
| 49 | 63.966 | 13.317 | 5.416 | 0.000 | 13.920 | 0.019 | 1.501 | 0.031 | 0.030 | 0.012 | 1.226 | 0.544 | 0.000 | 0.000 |
| 50 | 63.785 | 13.536 | 5.400 | 0.000 | 13.887 | 0.017 | 1.593 | 0.032 | 0.029 | 0.012 | 1.142 | 0.548 | 0.000 | 0.000 |
| 51 | 63.605 | 13.755 | 5.385 | 0.000 | 13.854 | 0.016 | 1.684 | 0.032 | 0.028 | 0.011 | 1.058 | 0.552 | 0.000 | 0.000 |
| 52 | 63.483 | 13.863 | 5.368 | 0.000 | 13.865 | 0.017 | 1.736 | 0.032 | 0.030 | 0.013 | 1.018 | 0.557 | 0.000 | 0.000 |
| 53 | 63.577 | 13.911 | 5.335 | 0.000 | 13.767 | 0.016 | 1.758 | 0.032 | 0.031 | 0.011 | 0.983 | 0.558 | 0.000 | 0.000 |
| 54 | 63.420 | 13.908 | 5.329 | 0.000 | 13.688 | 0.017 | 1.770 | 0.035 | 0.032 | 0.013 | 1.210 | 0.561 | 0.000 | 0.000 |
| 55 | 63.533 | 13.952 | 5.327 | 0.000 | 13.749 | 0.016 | 1.776 | 0.035 | 0.032 | 0.011 | 0.991 | 0.558 | 0.000 | 0.000 |
| 56 | 63.606 | 13.962 | 5.327 | 0.000 | 13.701 | 0.016 | 1.764 | 0.032 | 0.030 | 0.012 | 0.974 | 0.558 | 0.000 | 0.000 |
| 57 | 63.534 | 13.971 | 5.321 | 0.000 | 13.775 | 0.016 | 1.769 | 0.033 | 0.031 | 0.008 | 0.965 | 0.558 | 0.000 | 0.000 |
| 58 | 63.497 | 13.981 | 5.325 | 0.000 | 13.806 | 0.016 | 1.773 | 0.034 | 0.026 | 0.007 | 0.958 | 0.559 | 0.000 | 0.000 |
| 59 | 63.586 | 13.935 | 5.327 | 0.000 | 13.766 | 0.016 | 1.765 | 0.036 | 0.026 | 0.007 | 0.959 | 0.558 | 0.000 | 0.000 |
| 60 | 63.760 | 13.990 | 5.018 | 0.000 | 13.801 | 0.016 | 1.800 | 0.040 | 0.025 | 0.007 | 0.962 | 0.562 | 0.000 | 0.000 |
| 61 | 64.329 | 13.726 | 4.690 | 0.000 | 13.648 | 0.130 | 1.747 | 0.043 | 0.025 | 0.008 | 1.046 | 0.589 | 0.000 | 0.000 |
| 62 | 64.970 | 13.353 | 4.349 | 0.000 | 13.452 | 0.299 | 1.708 | 0.040 | 0.026 | 0.009 | 1.152 | 0.623 | 0.000 | 0.000 |
| 63 | 65.667 | 12.945 | 4.009 | 0.000 | 13.242 | 0.463 | 1.662 | 0.035 | 0.023 | 0.009 | 1.265 | 0.661 | 0.000 | 0.000 |
| 64 | 65.642 | 12.929 | 3.999 | 0.000 | 13.182 | 0.516 | 1.669 | 0.032 | 0.027 | 0.011 | 1.299 | 0.676 | 0.000 | 0.000 |
| 65 | 65.761 | 12.858 | 3.984 | 0.000 | 13.162 | 0.520 | 1.655 | 0.033 | 0.027 | 0.010 | 1.298 | 0.673 | 0.000 | 0.000 |
| 66 | 65.810 | 12.813 | 3.976 | 0.000 | 13.157 | 0.531 | 1.650 | 0.033 | 0.027 | 0.010 | 1.299 | 0.674 | 0.000 | 0.000 |
| 67 | 65.829 | 12.819 | 3.959 | 0.000 | 13.147 | 0.535 | 1.641 | 0.035 | 0.027 | 0.010 | 1.305 | 0.673 | 0.000 | 0.000 |
| 68 | 65.852 | 12.778 | 3.948 | 0.000 | 13.172 | 0.536 | 1.651 | 0.036 | 0.027 | 0.010 | 1.297 | 0.673 | 0.000 | 0.000 |
| 69 | 65.632 | 12.722 | 4.275 | 0.000 | 13.126 | 0.539 | 1.639 | 0.038 | 0.026 | 0.010 | 1.301 | 0.672 | 0.000 | 0.000 |
| 70 | 65.482 | 12.643 | 4.594 | 0.000 | 13.047 | 0.538 | 1.631 | 0.043 | 0.027 | 0.012 | 1.295 | 0.669 | 0.000 | 0.000 |
| 71 | 65.466 | 12.564 | 4.906 | 0.674 | 12.257 | 0.531 | 1.616 | 0.045 | 0.026 | 0.011 | 1.239 | 0.647 | 0.000 | 0.000 |
| 72 | 65.913 | 12.426 | 5.228 | 1.344 | 11.060 | 0.520 | 1.630 | 0.046 | 0.026 | 0.009 | 1.162 | 0.619 | 0.000 | 0.000 |
| 73 | 66.291 | 12.297 | 5.546 | 2.108 | 9.874 | 0.510 | 1.616 | 0.048 | 0.025 | 0.009 | 1.067 | 0.590 | 0.000 | 0.000 |
| 74 | 66.613 | 12.136 | 5.844 | 2.989 | 8.674 | 0.500 | 1.600 | 0.045 | 0.025 | 0.007 | 0.987 | 0.561 | 0.000 | 0.000 |
| 75 | 67.438 | 12.081 | 6.103 | 3.371 | 7.370 | 0.490 | 1.606 | 0.045 | 0.026 | 0.008 | 0.907 | 0.536 | 0.000 | 0.000 |
| 76 | 66.985 | 11.938 | 6.296 | 4.355 | 6.861 | 0.483 | 1.590 | 0.044 | 0.024 | 0.008 | 0.875 | 0.520 | 0.000 | 0.000 |
| 77 | 66.954 | 11.921 | 6.410 | 4.362 | 6.802 | 0.481 | 1.587 | 0.043 | 0.023 | 0.008 | 0.870 | 0.519 | 0.000 | 0.000 |
| 78 | 66.924 | 11.903 | 6.523 | 4.369 | 6.743 | 0.480 | 1.584 | 0.043 | 0.022 | 0.008 | 0.865 | 0.517 | 0.000 | 0.000 |
| 79 | 66.822 | 11.886 | 6.636 | 4.403 | 6.726 | 0.480 | 1.577 | 0.041 | 0.022 | 0.008 | 0.863 | 0.517 | 0.000 | 0.000 |
| 80 | 66.720 | 11.868 | 6.749 | 4.437 | 6.709 | 0.479 | 1.570 | 0.040 | 0.021 | 0.008 | 0.862 | 0.516 | 0.000 | 0.000 |

The second substrate may be similar to the first substrate, except that the second substrate does not absorb, or does not substantially absorb, light at the laser beam wavelength. The second substrate may, in some embodiments, have an absorption less than about 1 cm$^{-1}$ at the laser's operating wavelength, for example, less than about 0.5 cm$^{-1}$, less than about 0.3 cm$^{-1}$, or less than about 0.1 cm$^{-1}$.

Accordingly, the second substrate is not doped with at least one light absorbing species, such as a transition metal or rare earth metal ion, or contains no or only a trace or small amount of absorbing species such that the absorption at the operating wavelength remains sufficiently low (less than about 1 cm$^{-1}$). The second substrate may otherwise be similar in composition to the first substrate, or may have a different composition altogether.

In certain embodiments, the first substrate may be a glass-ceramic substrate and the second substrate may be a glass substrate comprising the same or different oxides than the first substrate (with the exception of the light absorbing species). By way of a non-limiting example, the second substrate may be Gorilla® glass, whereas the first substrate may be a Gorilla® glass-ceramic doped with at least one transition metal or rare earth metal ion. In other embodiments, the first and second substrate may have different compositions. For example, the second substrate may be a soda-lime glass, whereas the first substrate may be an alkali-aluminosilicate glass-ceramic doped with at least one transition metal or rare earth metal ion. Other combinations are envisioned and within the ability of one skilled in the art.

The methods disclosed herein allow for the sealing, e.g., hermetic sealing, of substrates having higher CTE values, for example, greater than about 5 ppm/° C., such as greater than about 6 ppm/° C., greater than about 7 ppm/° C., greater than about 8 ppm/° C., or greater than about 9 ppm/° C., including all ranges and subranges therebetween. In certain embodiments, the first and/or second substrate may have a CTE ranging from about 5 to about 10 ppm/° C., such as from about 6 to about 8 ppm/° C., including all ranges and subranges therebetween. Advantageously, the methods disclosed herein allow for a seal to be formed between substrates having different CTE values. For example, the first substrate may be a high CTE material, whereas the second substrate may be a low CTE material, or vice versa. According to various embodiments, both the first and second substrates have a high CTE, e.g., a CTE greater than about 5 ppm/° C.

According to various embodiments, at least one third substrate may be inserted between or deposited on the first and second substrates. For instance, a third substrate may be chosen from circuitry, organic layers, cathodes, anodes, and/or any other substrate or object that might benefit from a hermetic environment. In the case of OLEDs, at least one organic layer, a cathode, and an anode may be positioned between the first and second substrates. In these embodiments, an organic layer may be deposited on the surfaces of the first and/or second substrate forming the substrate interface. The electrodes may be positioned between the substrates and the glass package hermetically sealed to produce an OLED display. Other hermetically sealed packages comprising different substrates and items are envisioned and within the scope of the instant disclosure.

Methods

According to the methods disclosed herein, the first and second substrates are brought into contact to form a substrate interface. The substrate interface is referred to herein as the point of contact between the surfaces of the first and second substrates, e.g., the surfaces to be joined by the weld or seal. The substrates may be brought into contact by any means known in the art and may, in certain embodiments, be brought into contact using force, e.g., an applied compressive force. By way of another non-limiting example, the substrates may be arranged between two plates and pressed together. In certain embodiments, clamps, brackets, and/or other fixtures may be used to apply a compressive force so as to ensure good contact at the substrate interface. According to various non-limiting embodiments, two silica plates may be used, although plates comprising other materials are envisioned. Advantageously, if plates are used, the plate adjacent the second substrate should be transparent and/or should not absorb light at the laser wavelength, so as to ensure that the laser beam light is concentrated at the substrate interface. The plate adjacent the first substrate can be transparent in some embodiments, but can also be constructed of any suitable material.

The laser may be chosen from any suitable laser known in the art for substrate welding. For example, the laser may emit light at UV (~350-400 nm), visible (~400-700 nm), or NIR (~750-1400 nm) wavelengths. In certain embodiments, a high-repetition pulsed UV laser operating at about 355 nm, or any other suitable UV wavelength, may be used. In other embodiments, a continuous wave laser operating at about 532 nm, or any other suitable visible wavelength, may be used. In further embodiments, a near-infrared laser operating at about 810 nm, or any other suitable NIR wavelength, may be used. According to various embodiments, the laser may operate at a predetermined wavelength ranging from about 300 nm to about 1600 nm, such as from about 350 nm to about 1400 nm, from about 400 nm to about 1000 nm, from about 450 nm to about 750 nm, from about 500 nm to about 700 nm, or from about 600 nm to about 650 nm, including all ranges and subranges therebetween.

According to various embodiments, the laser beam is directed through the second substrate (e.g., incident on the second substrate) onto the substrate interface, whereby the first substrate absorbs a sufficient amount of light to create a weld between the substrates. In certain embodiments, the laser beam operates at an average power greater than about 3 W, for example, ranging from about 6 W to about 13 W, such as from about 7 W to about 12 W, from about 8 W to about 11 W, or from about 9 W to about 10 W, including all ranges and subranges therebetween. The laser may operate at any frequency and may, in certain embodiments, may operate in a quasi-continuous or continuous manner. In other embodiments, the laser may operate in burst mode having a plurality of bursts with a time separation between individual pulses in a burst at about 50 MHz or between 100 kHz to 1 MHz, or between 1 MHz and 50 MHz, including all ranges and subranges therebetween. In some non-limiting single pulse embodiments, the laser may have a frequency or time separation between adjacent pulses (repetition rate) ranging from about 0.5 MHz to about 5 MHz, such as from about 1 MHz to about 4 MHz, or from about 2 MHz to about 3 MHz, for example, from about 1 MHz to about 3 MHz, including all ranges and subranges therebetween. According to various embodiments, the laser may have a repetition rate greater than about 1 MHz. The duration or pulse width of the pulse may vary, for example, the duration may be less than about 1 ns in certain embodiments. In other embodiments, the pulse width or duration may be less than about 15 ps, less than about 10 ps, or less than about 1 ps.

According to various embodiments, the laser beam may be focused on the substrate interface in various configurations such that the beam may be more or less focused on the first or second substrate. For example, the beam may be slightly more focused on the first substrate or slightly more focused on the second substrate. In certain embodiments, the laser beam may be focused just below the substrate interface, e.g., slightly favoring the first substrate. In other embodiments, the laser beam may be focused along a line using an axicon in the associated laser optics to thereby providing a Gaussian Bessel beam to irradiate a substrate(s) of interest. A detailed explanation of the various non-limiting focal configurations is set forth in the Examples that follow.

According to various embodiments, the beam may be directed at and focused on the substrate interface such that the beam spot diameter on the interface may be less than about 300 microns. For example, the beam spot diameter may be less than about 200 microns, or may range from about 75 microns to about 225 microns, such as from about 100 microns to about 200 microns, including all ranges and subranges therebetween.

The laser beam may be scanned or translated along the substrates in any pattern or predetermined path, such as a square, rectangular, circular, oval, or any other suitable pattern or shape, for example, to hermetically seal one or more devices positioned between the substrates of interest. The translation speed at which the laser beam (or substrate) moves along the interface may vary by application and may depend, for example, upon the composition of the first and second substrates and/or the focal configuration and/or the laser power, frequency, and/or wavelength. In certain embodiments, the laser may have a translation speed ranging from about 10 mm/s to about 1000 mm/s, for example, from about 50 mm/s to about 700 mm/s, such as greater than about 100 mm/s, greater than about 200 mm/s, greater than about 300 mm/s, greater than about 400 mm/s, greater than about 500 mm/s, or greater than about 600 mm/s, including all ranges and subranges therebetween.

According to various embodiments disclosed herein, the laser wavelength, pulse duration, repetition rate, average power, focusing conditions, and other relevant parameters may be varied so as to produce an energy sufficient to weld the first and second substrates together. It is within the ability of one skilled in the art to vary these parameters as necessary for a desired application. In various embodiments, the laser fluence (or intensity) is below the damage threshold of the first and/or second substrate, e.g., the laser operates under conditions intense enough to weld the substrates together, but not so intense as to damage the substrates. In certain embodiments, the laser beam may operate at a translation speed that is less than or equal to the product of the diameter of the laser beam at the substrate interface and the repetition rate of the laser beam.

The laser beam may form, in some embodiments, a weld or fusion line (e.g., region of sealing) on the substrate interface having a varying width. In some embodiments, the weld may have a width ranging from about 70 to about 220 microns, for example, from about 100 to about 200 microns, from about 120 to about 180 microns, or from about 130 to about 170 microns, including all ranges and subranges therebetween.

Figure 1:
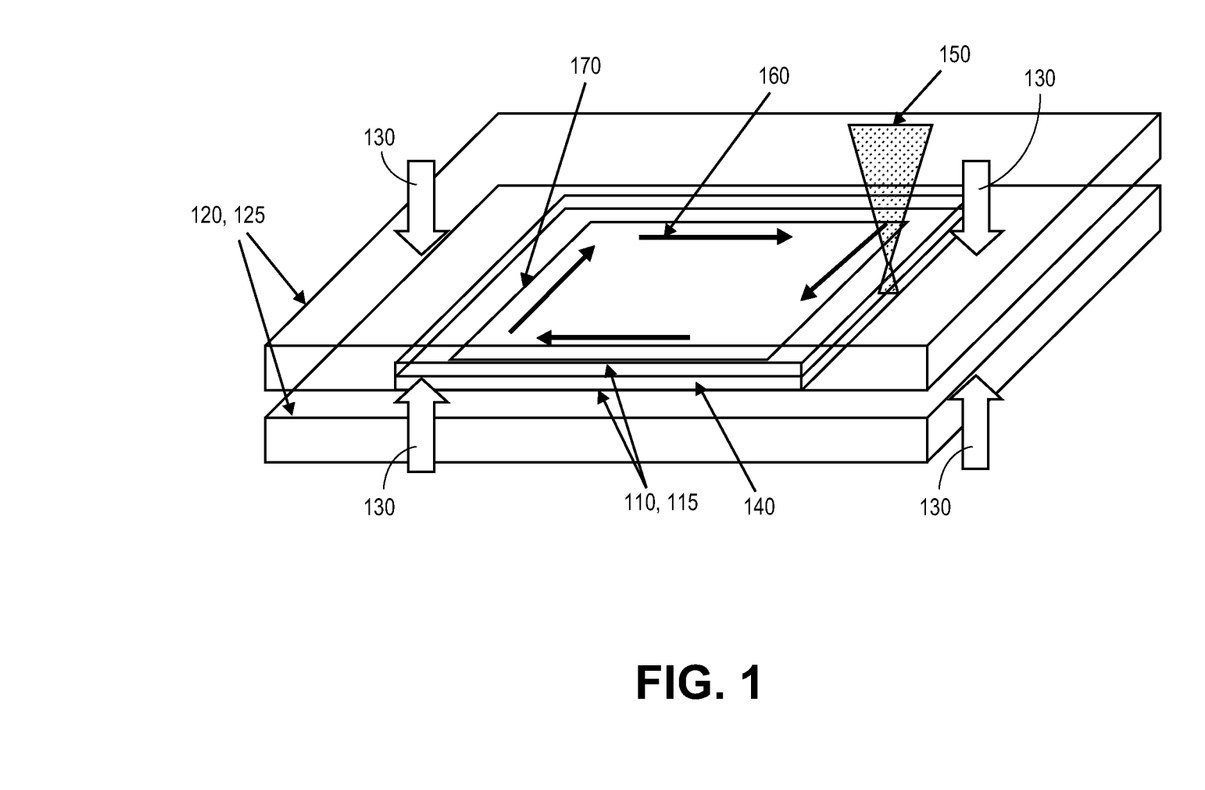
FIG. 1 is a side view illustrating the components for producing a sealed package according to various embodiments of the disclosure.

Referring to FIG. 1, which is a side view of one possible configuration for carrying out the method disclosed herein, a first substrate 110 and a second substrate 115 are placed between two plates 120 and 125 and brought into contact using an applied force 130 to form a substrate interface 140. A laser beam 150 may then be scanned along a predetermined path 160 to form a fusion line 170. A sealed glass package may thus be formed. Optionally, a third substrate may be included between substrates 110 and 115, although this element is not illustrated in FIG. 1. It is also to be understood that various other modifications to the configuration are not pictured but envisioned by and included in the scope of the disclosure.

It will be appreciated that the various disclosed embodiments may involve particular features, elements or steps that are described in connection with that particular embodiment. It will also be appreciated that a particular feature, element or step, although described in relation to one particular embodiment, may be interchanged or combined with alternate embodiments in various non-illustrated combinations or permutations.

It is also to be understood that, as used herein the terms "the," "a," or "an," mean "at least one," and should not be limited to "only one" unless explicitly indicated to the contrary. Thus, for example, reference to "an oxide" includes examples having two or more such "oxides" unless the context clearly indicates otherwise.

Ranges can be expressed herein as from "about" one particular value, and/or to "about" another particular value. When such a range is expressed, examples include from the one particular value and/or to the other particular value. For example, "about 1-5%" is intended to denote from about 1% to about 5%, from about 1% to 5%, from 1% to about 5%, or from 1% to 5%. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a glass that comprises A+B+C include embodiments where a glass consists of A+B+C and embodiments where a glass consists essentially of A+B+C.

It will be apparent to those skilled in the art that various modifications and variations can be made to the present disclosure without departing from the spirit and scope of the disclosure. Since modifications combinations, sub-combinations and variations of the disclosed embodiments incorporating the spirit and substance of the disclosure may occur to persons skilled in the art, the disclosure should be construed to include everything within the scope of the appended claims and their equivalents.

The following Examples are intended to be non-restrictive and illustrative only, with the scope of the invention being defined by the claims.

EXAMPLES

UV Laser Welding of Glass and Glass-Ceramic Substrates

A Daytona UV laser from Coherent operating at 1 MHz and 2 MHz frequencies (335 nm wavelength, 1 ns pulse duration) was used to fuse a transparent Gorilla® glass (second substrate) and a black Gorilla® glass-ceramic (first substrate). The laser output can be considered to be quasi-continuous, as the significant beam overlap and short interval between pulses reduces or prevents substrate cooling between pulses, even at high welding speeds. The laser was operated at lower mean powers ranging between 6 W and 13 W to reduce ablation effects and maximize substrate heating. The laser beam was scanned using a Galvanometer with a 53-mm telcentric objective with an estimated focal spot size of about 3 microns.

Figure 2:
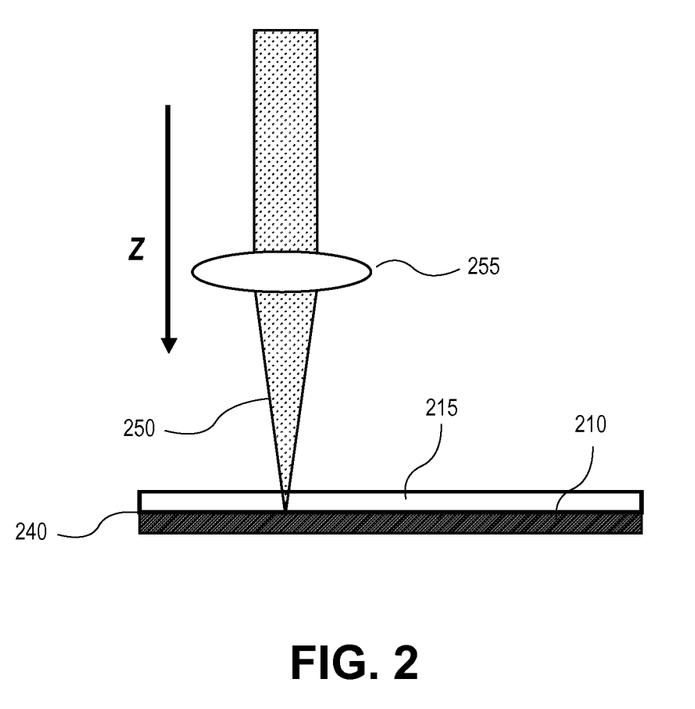
FIG. 2 is a side view illustrating a focusing schematic according to various embodiments of the disclosure.

FIG. 2 illustrates a side view of a focusing schematic where a first substrate 210 and second substrate 215 are in contact to form a substrate interface 240. A laser beam 250 having a Z coordinate may be focused through a focusing lens 255 through the second substrate 215 and onto the substrate interface 240.

Four focusing conditions were determined for experimentation based on the Z coordinate of the focusing lens. Focusing on the interface corresponded to Z=184 mm (3 micron spot diameter at the interface), Z=184.5 mm (75 micron spot diameter at the interface, Z=185 mm (150 micron spot diameter at the interface), and Z=185.5 mm (225 micron spot diameter at the interface). Z-coordinates greater than 184 correspond to focusing more on the first substrate, whereas Z-coordinates less than 184 mm correspond to focusing more on the second substrate.

A weld pattern having a loop with straight lead-in and lead-out lines was used. Scanning speeds ranged from 50 mm/s to 700 mm/s. The welds were examined for cracks, especially in the areas of overlap, which are most vulnerable to defects due to over-writing. Table II illustrates the quality of welding achieved at Z=185 mm focusing condition (150 micron spot diameter at the interface) and 2 MHz, using various translation speeds at varying powers. Table III illustrates the quality of welding at Z=185.5 mm (225 micron spot diameter at the interface) and 2 MHz. Table IV illustrates the quality of welding at 184.5 mm (75 micron spot diameter at the interface) and 2 MHz. Table V illustrates the quality of welding at Z=185 mm (150 micron spot diameter at the interface) and 1 MHz.

Numbers represent the weld width in microns. Welds observed to have minor defects (caused by particles on glass or other insignificant defects) are marked with "*", whereas welds with major defects (process- and/or glass-imposed limit) are marked with "**". Blanks without numbers or symbols indicate that the particular combination of parameters was not carried out. In most cases, these parameters were believed to be outside the working range after analyzing the relevant experimental performance trend(s).

TABLE II

Quality of Welding (Z = 185 mm, 150 micron spot diameter, 2 MHz)

|  | 6W | 7W | 8W | 9.04W | 10.17W | 11.2W | 12.33W | 13.2W |
|---|---|---|---|---|---|---|---|---|
| 50 mm/s | 170 | 163 | 174 | 180 |  |  |  |  |
| 100 mm/s | 131 | 140 | 150 | 154 | 160 | 166 | 172 | 172 |
| 200 mm/s | 98 | 96 | 118 | 118 | 135 | 138 | 149 | 152 |
| 300 mm/s |  | 70* | 104 | 102* | 117 | 128 |  |  |
| 400 mm/s |  |  | 70 | 83* | 106 | 107 | 115 | 134 |
| 500 mm/s |  |  |  | ** | 105 | 114 |  |  |
| 600 mm/s |  |  |  | 91 | 96 | 109 | 115 | 125 |
| 700 mm/s |  |  |  | 91* | 98* |  |  |  |

TABLE III

Quality of Welding (Z = 185.5 mm, 225 micron spot diameter, 2 MHz)

|  | 6W | 7W | 8W | 9.04W | 10.17W | 11.2W | 12.33W | 13.2W |
|---|---|---|---|---|---|---|---|---|
| 50 mm/s | 163 | 190 | 199.5 | 224 | 226* | ** |  | ** |
| 100 mm/s | ** | 154* | 170* | 163* | 183* | ** |  | 211* |
| 200 mm/s |  | ** | ** | ** | ** | ** |  | ** |
| 300 mm/s |  |  |  |  |  |  |  |  |
| 400 mm/s |  |  |  |  |  | ** |  | ** |
| 600 mm/s |  |  |  |  |  | ** |  | ** |

TABLE IV

Quality of Welding (Z = 184.5 mm, 75 micron spot diameter, 2 MHz)

|  | 6W | 7W | 8W | 9.04W | 10.17W | 11.2W | 12.33W | 13.2W |
|---|---|---|---|---|---|---|---|---|
| 50 mm/s | ** | ** |  |  |  |  |  |  |
| 100 mm/s | 102 | 108 | ** | ** |  |  |  | 99 |
| 200 mm/s | 89 | 95 | 95 | 95 | 98 | ** | ** | 99 |
| 300 mm/s | 81 | 77 |  |  |  | 95 |  | 98 |
| 400 mm/s |  | 77 | 84 | 83 | 91 | 93 | 95 |  |
| 600 mm/s |  | 78 | 80 | 88 | 91 | 88 | 92 | 93 |

TABLE V

Quality of Welding (Z = 185 mm, 150 micron spot diameter, 1 MHz)

|  | 7W | 8W | 9.04W | 10.17W | 11.2W | 12.33W | 13.2W |
|---|---|---|---|---|---|---|---|
| 50 mm/s | 167 | 170 | ** |  |  |  |  |
| 100 mm/s | 140 | 147 | 150* |  |  |  |  |
| 200 mm/s | 100 | 115 | 130 | 144 |  |  |  |
| 300 mm/s | 63* | 92 | 92* |  | 116 | 122 | ** |
| 400 mm/s |  | ** | ** |  |  |  |  |

As demonstrated by Tables II-V, there may be a wide range of conditions that produces welds of sufficient width without cracking or defects. The widths of the welds depend, at least in part, upon the tightness of the focusing. For instance, when Z=185.5 (largest tested spot diameter, 225 microns), the weld width had an observed lower boundary of about 160 microns. When Z=184.5 (smallest tested spot diameter, 75 microns), the weld width had an observed lower boundary of about 75 microns. Table VI shows the observed upper and lower limits (without defects) on the weld width as a function of focusing conditions at 2 MHz.

TABLE VI

Upper and Lower Weld Width Limits at 2 MHz

|  | Weld Width (microns) | |
|---|---|---|
|  | Lower Limit | Upper Limit |
| Z = 184.5 mm | 77 | 108 |
| Z = 185 mm | 91 | 172 |
| Z = 185.5 mm | 163 | 224 |

Without wishing to be bound by theory, it is believed that the weld width corresponds to the energy E absorbed by the first substrate per unit of weld length, which may be proportional to (laser power)/(scanning speed). Accordingly, the weld width becomes narrower at lower E values because the glass does not melt and weld as efficiently when the energy is low. The upper limit on weld width is believed to be restricted by the residual stress caused by too much energy, which leads to cracking. As seen in Table V, the weld widths achievable at Z=185 mm and 1 MHz are almost the same as those achievable at Z=185 and 2 MHz (Table II), although these widths are achievable using a narrower range of power and speeds.

Based on these observations, focusing the laser beam on the substrate interface such that the beam diameter at the interface ranges from about 75 to about 225 microns, or from about 100 to about 200 microns, may be advantageous according to various embodiments of the disclosure. Similarly, controlling scanning speed and laser power so as to produce weld widths ranging from about 100 to about 200 microns, or from about 120 to about 180 microns, may also be advantageous according to certain embodiments of the disclosure. Without wishing to be bound by theory, it is believed that narrower weld widths will not provide sufficient weld strength, whereas wider weld widths may be prone to cracking. Additionally, higher frequency laser pulses may be desirable, as they may provide a more continuous wave of energy and, thus, a wider range of working conditions due to the increased overlap between pulses.

What is claimed is:

1. A method for welding a first and second substrate comprising:
   (a) bringing the first and second substrates into contact to form a substrate interface;
   (b) after forming the substrate interface, directing a laser beam operating at a predetermined wavelength through the second substrate onto the substrate interface;
   wherein the first substrate absorbs light from the laser beam in an amount sufficient to form a weld between the first substrate and the second substrate;
   wherein the first substrate has an absorption at the predetermined wavelength of greater than about 10 $cm^{-1}$ and the second substrate has an absorption at the predetermined wavelength of less than about 1 $cm^{-1}$;
   wherein at least one of the first and second substrates has a coefficient of thermal expansion greater than about 8 ppm/° C.; and
   wherein the laser beam converges to a focal point that is remote from the substrate interface.

2. The method of claim 1, wherein a lens is disposed optically upstream of both the first and second substrates such that the laser beam passes through the lens before passing through the second substrate.

3. The method of claim 2, wherein the lens is a focusing lens causing the laser beam to converge at the focal point.

4. The method of claim 3, wherein the focusing lens is telecentric.

5. The method of claim 1, wherein the focal point is disposed within a volume of the first substrate.

6. The method of claim 5, wherein the first substrate is disposed optically downstream of both the second substrate and the substrate interface and the interface is disposed optically downstream of the second substrate such that the laser beam passes through the second substrate, then the substrate interface, before arriving at the focal point.

7. The method of claim 1, comprising adjusting a location of the focal point based on a desired diameter of the laser beam at the substrate interface.

8. The method of claim 1, comprising adjusting a translation speed of the laser beam based on the focal point location.

9. The method of claim 8, wherein the focal point is disposed below the substrate interface and within a volume of the first substrate.

10. The method of claim 1, wherein the first substrate has an absorption at the predetermined wavelength of greater than about 50 $cm^{-1}$.

11. The method of claim 1, wherein the laser beam operates at a translation speed ranging from about 10 mm/s to about 1000 mm/s.

12. The method of claim 1, wherein the laser beam operates at a power level greater than about 3 W and a repetition rate greater than about 1 MHz.

13. The method of claim 1, wherein the laser beam operates at a power level ranging from about 6 W to about 13 W and a repetition rate ranging from about 1 MHz to about 3 MHz.

14. The method of claim 1, wherein the weld has a width ranging from about 70 to about 200 microns.

15. The method of claim 1, wherein a hermetic seal is formed between the first and second substrates.

16. The method of claim 1, further comprising placing at least one third substrate between the first and second substrates.

17. The method of claim 16, wherein the at least one third substrate is an organic layer, cathode, anode, or combination thereof.

18. The method of claim 16, wherein the at least one third substrate comprises an organic light emitting diode.

19. A method for producing a glass and/or a glass-ceramic packaging, comprising:
   (a) placing a third substrate on a first or a second substrate;
   (b) bringing the first and second substrates into contact to form a substrate interface;
   (c) after forming the substrate interface, directing a laser beam operating at a predetermined wavelength through the second substrate onto the substrate interface;
   wherein the first substrate absorbs light from the laser beam in an amount sufficient to form a weld between the first substrate and the second substrate;
   wherein the first substrate has an absorption at the predetermined wavelength of greater than about 10 $cm^{-1}$ and the second substrate has an absorption at the predetermined wavelength of less than about 1 $cm^{-1}$,
   wherein at least one of the first and second substrates has a coefficient of thermal expansion greater than about 8 ppm/° C.,
   wherein the first and/or second substrates are chosen from glasses, ceramics, and glass-ceramics,
   wherein the weld between the first and second substrates hermetically seals the third substrate, and
   wherein the laser beam converges to a focal point that is remote from the substrate interface, the focal point being disposed below the substrate interface and within a volume of the first substrate.

20. A method for welding a first and second substrate comprising:
   (a) bringing the first and second substrates into contact to form a substrate interface;
   (b) after forming the substrate interface, directing a laser beam operating at a predetermined wavelength through the second substrate onto the substrate interface;

wherein the first substrate absorbs light from the laser beam in an amount sufficient to form a weld between the first substrate and the second substrate;

wherein the first substrate has an absorption at the predetermined wavelength of greater than about 10 $cm^{-1}$ and the second substrate has an absorption at the predetermined wavelength of less than about 1 $cm^{-1}$;

wherein a coefficient of thermal expansion of the first substrate is greater than a coefficient of thermal expansion of the second substrate; and wherein the laser beam converges to a focal point that is remote from the substrate interface.

21. The method of claim 20, further comprising placing at least one third substrate between the first and second substrates, wherein the at least one third substrate is selected from the group consisting of: circuitry, an organic layer, a cathode, an anode, and combinations thereof.

22. The method of claim 20 wherein the coefficient of thermal expansion of the first substrate is greater than about 8 ppm/° C.

23. The method of claim 20 wherein a hermetic seal is formed between the first and second substrates.

24. The method of claim 20 comprising passing the laser beam through a focusing lens before the laser beam reaches the first substrate and before the laser beam reaches the second substrate, the focusing lens causing the laser beam to converge at the focal point, the focal point being disposed below the substrate interface and within the first substrate.

25. The method of claim 24, comprising:

adjusting a location of the focal point based on a desired diameter of the laser beam at the substrate interface; and adjusting a translation speed of the laser beam based on the focal point location.

26. The method of claim 24, wherein the focusing lens is telecentric.

* * * * *

UNITED STATES PATENT AND TRADEMARK OFFICE
CERTIFICATE OF CORRECTION

PATENT NO. : 10,297,787 B2
APPLICATION NO. : 15/305553
DATED : May 21, 2019
INVENTOR(S) : Matthew John Dejneka et al.

Page 1 of 1

It is certified that error appears in the above-identified patent and that said Letters Patent is hereby corrected as shown below:

In the Claims

In Column 15, Line 43, Claim 1, delete "1 $cm^{-1}$ ;" and insert -- 1 $cm^{-1}$; --, therefor.

In Column 16, Line 19, Claim 13, delete "1MHz" and insert -- 1 MHz --, therefor.

Signed and Sealed this
Seventeenth Day of December, 2019

Andrei Iancu
*Director of the United States Patent and Trademark Office*